United States Patent
Toda et al.

(10) Patent No.: US 9,450,089 B2
(45) Date of Patent: Sep. 20, 2016

(54) SEMICONDUCTOR DEVICE

(71) Applicant: Renesas Electronics Corporation, Kanagawa (JP)

(72) Inventors: Takeshi Toda, Kanagawa (JP); Mototsugu Okushima, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/606,064

(22) Filed: Jan. 27, 2015

(65) Prior Publication Data
US 2015/0214359 A1 Jul. 30, 2015

(30) Foreign Application Priority Data
Jan. 28, 2014 (JP) ................... 2014-013734

(51) Int. Cl.
H01L 27/148 (2006.01)
H01L 29/78 (2006.01)
H01L 27/088 (2006.01)
H01L 27/02 (2006.01)
H01L 21/8234 (2006.01)

(52) U.S. Cl.
CPC ....... *H01L 29/7816* (2013.01); *H01L 27/0207* (2013.01); *H01L 27/088* (2013.01); *H01L 21/823418* (2013.01)

(58) Field of Classification Search
CPC ................. H01L 27/088; H01L 29/78; H01L 21/823412; H01L 29/1025–29/1033; H01L 29/78696; H01L 27/11807; H01L 2027/11805; H01L 29/7816
See application file for complete search history.

(56) References Cited

U.S. PATENT DOCUMENTS 5,501,994 A * 3/1996 Mei ..................... H01L 27/0922
257/E27.064

FOREIGN PATENT DOCUMENTS

JP 10-256541 9/1998

* cited by examiner

*Primary Examiner* — Cuong B Nguyen
(74) *Attorney, Agent, or Firm* — Mattingly & Malur, PC

(57) ABSTRACT

A decrease in resistance against an abnormal current of a semiconductor device is suppressed. A first transistor is sandwiched between two second transistors (a first one and a second one of the second transistors) in a second direction. Both of a distance between a second source contact and a second drain contact that are coupled to the one second transistor, and a distance between a second source contact and a second drain contact that are coupled to the other second transistor are larger than a distance between a second source contact and a second drain contact that are coupled to a third one of the second transistors located farthest from the first transistor in the second direction.

10 Claims, 16 Drawing Sheets

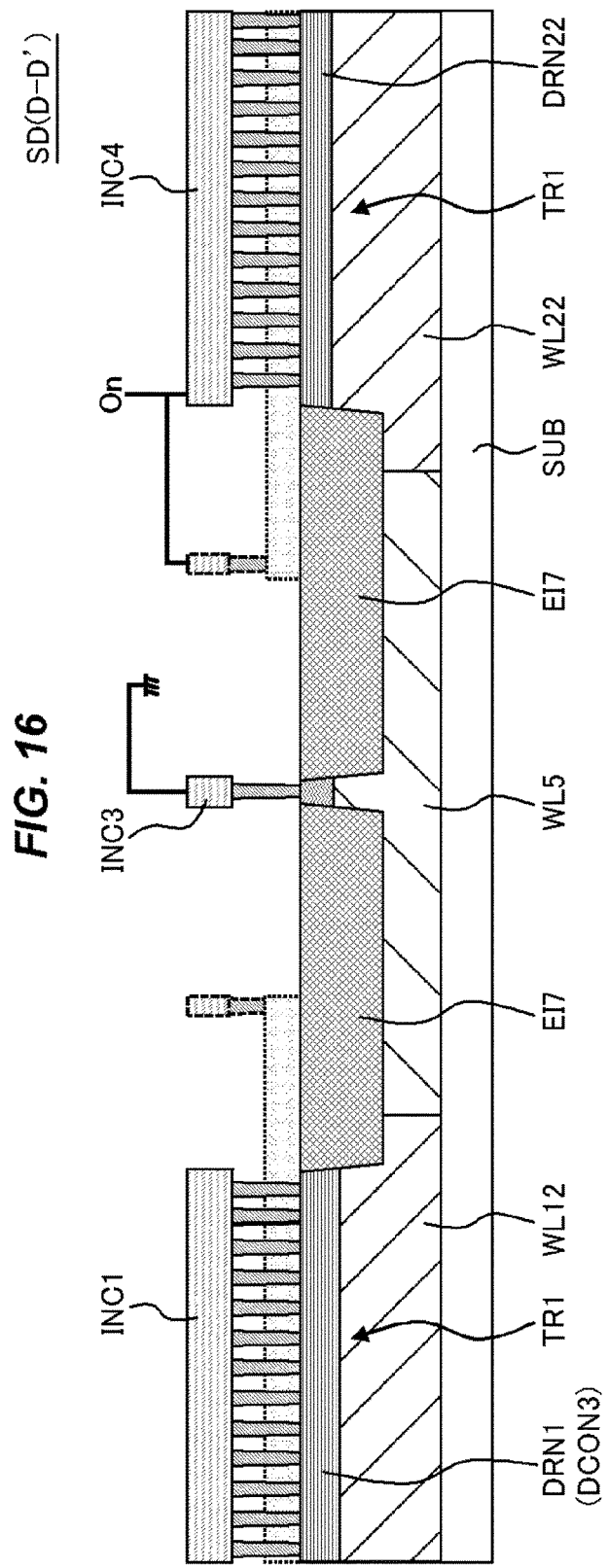

SEMICONDUCTOR DEVICE

CROSS-REFERENCE TO RELATED APPLICATION

The disclosure of Japanese Patent Application No. 2014-013734 filed on Jan. 28, 2014 including the specification, drawings and abstract is incorporated herein by reference in its entirety.

BACKGROUND

The present invention relates to a semiconductor device, and is, for example, a technology applicable to a semiconductor device having a current mirror circuit.

One of electric circuits is a current mirror circuit. The current mirror circuit is, for example, used for an amplifier circuit. When the current mirror circuit as the amplifier circuit is provided in a semiconductor device, it is desirable to provide a plurality of output transistors around an input transistor, and to give the same characteristic to these output transistors. For example, a plurality of layout examples of output transistors is described in Japanese Patent Laid-Open No. 1998-256541 (Patent Literature 1).

The present inventor examined reduction in size of a first transistor and a plurality of second transistors in a semiconductor device in which the first transistor serving as an input transistor is sandwiched by the second transistors serving as output transistors. At this time, the present inventor found out that when an abnormal current, such as static electricity, was input to a drain of the second transistor, the abnormal current concentrated on the second transistor closest to the first transistor. When the abnormal current concentrates on the particular second transistor, resistance against the abnormal current of the semiconductor device decreases. A main problem of the present application is to protect the resistance against the abnormal current of the semiconductor device from decreasing. The other problems and the new feature will become clear from the description of the present specification and the accompanying drawings

SUMMARY

According to one embodiment, both of a first gate electrode of a first transistor and a second gate electrode of a second transistor extend in a first direction.

Additionally, a plurality of the second transistors is arranged side-by-side in a direction (a second direction) intersecting with the first direction. The first transistor is sandwiched between a first one of the second transistors and a second one of the second transistors in the second direction. A first source contact is coupled to a first source region, and a first drain contact is coupled to a first drain region. A plurality of second source contacts are coupled to second source regions different from each other, and are electrically coupled to each other. A plurality of second drain contacts is coupled to second drain regions different from each other, and is electrically coupled to each other. Additionally, both of a distance (a first distance) between the second source contact and the second drain contact that are coupled to the first one of the second transistors, and a distance (a second distance) between the second source contact and the second drain contact that are coupled to the second one of the second transistors are larger than a distance (a third distance) between the second source contact and the second drain contact that are coupled to a third one of the second transistors (the second transistor) located farthest from the first transistor in the second direction.

According to the one embodiment, decrease in the resistance against the abnormal current of the semiconductor device can be suppressed.

BRIEF DESCRIPTION OF THE DRAWINGS

FIG. 16 is a cross-sectional view taken along a line D-D' of FIG. 13.

DETAILED DESCRIPTION

Hereinafter, embodiments will be explained using drawings. Note that in all the drawings, the same symbol is attached to the same component, and explanation thereof will be appropriately omitted.

(First Embodiment)

Figure 1:
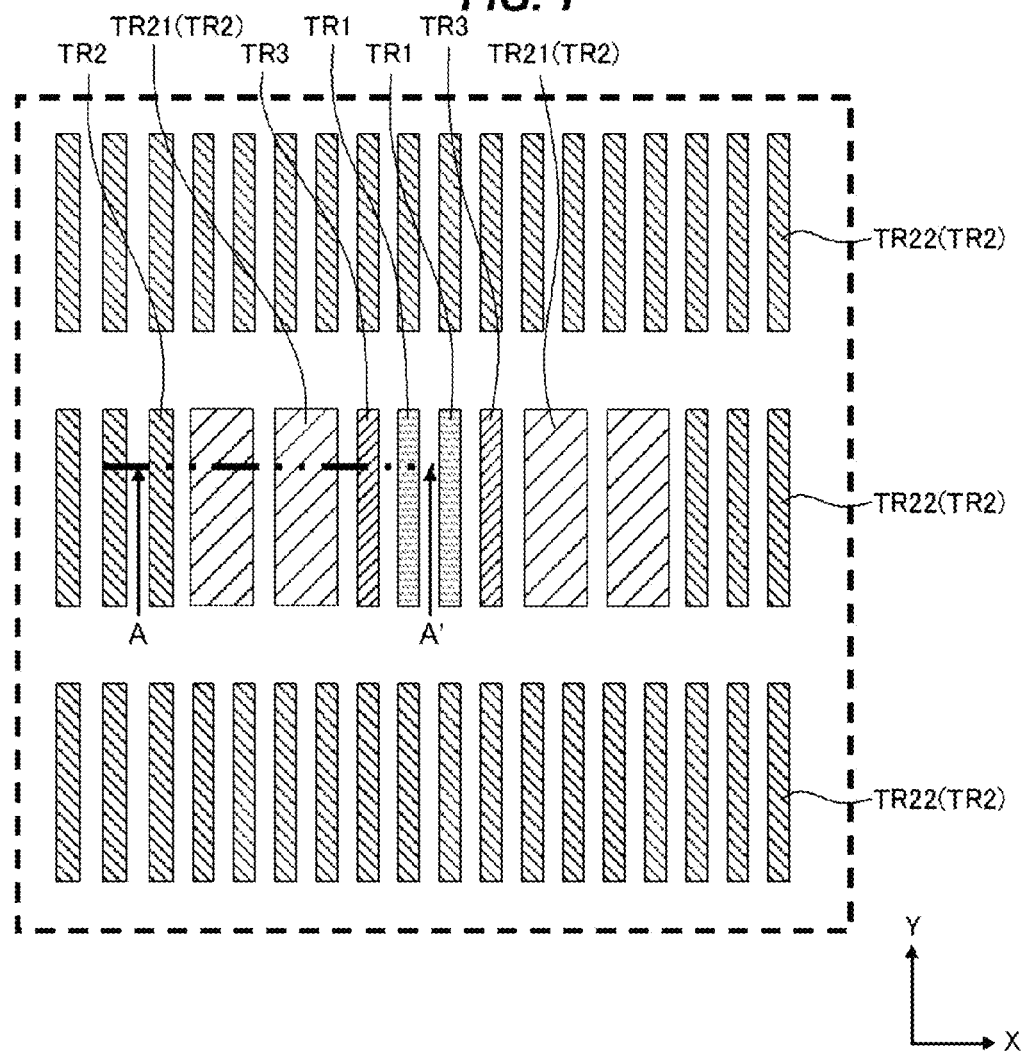
FIG. 1 is a plan view showing a configuration of a semiconductor device according to a First Embodiment.
Figure 2:
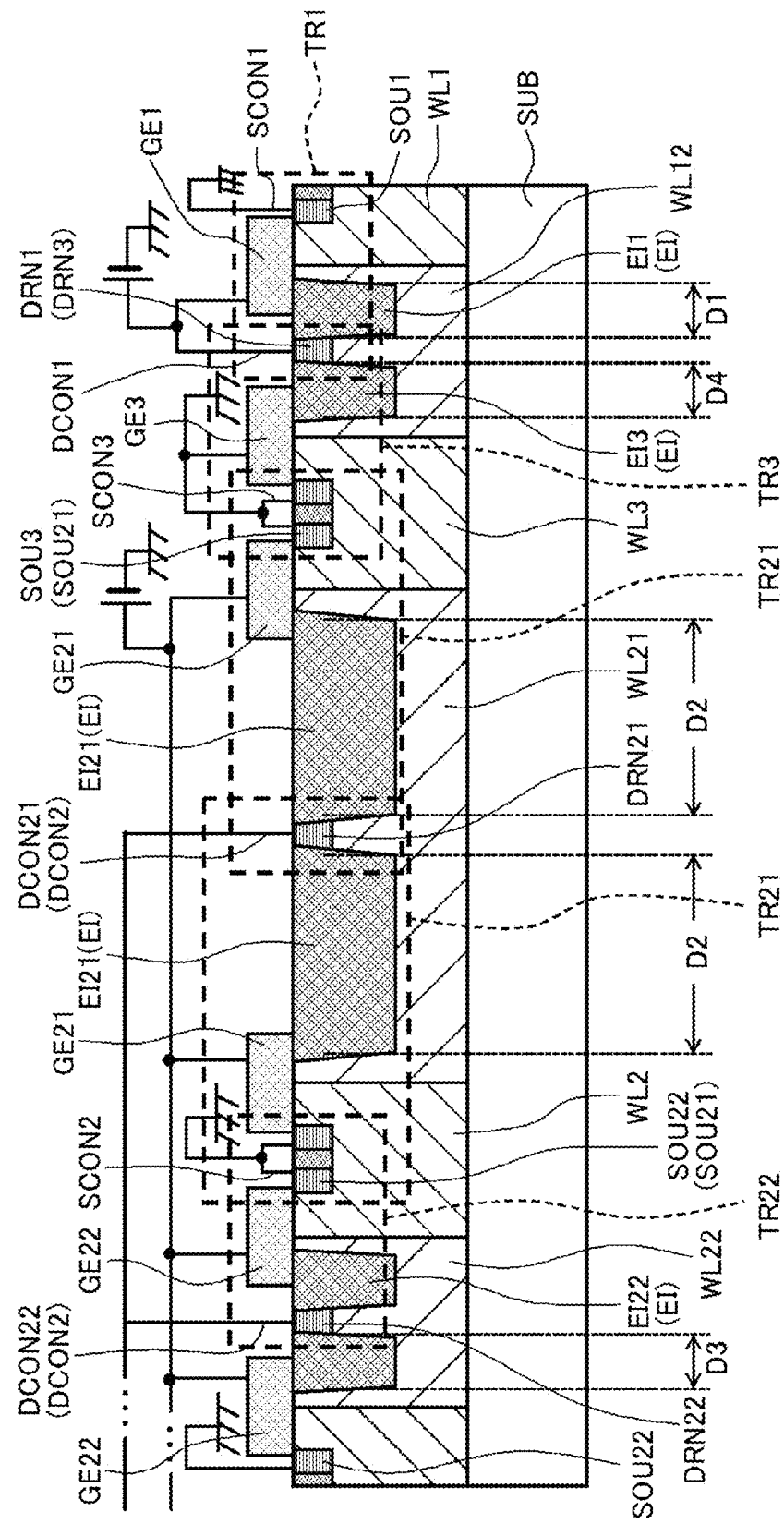
FIG. 2 is a diagram schematically showing an A-A' cross section of FIG. 1.

FIG. 1 is a plan view showing a configuration of a semiconductor device SD according to a First Embodiment. FIG. 2 is a diagram schematically showing an A-A' cross section of FIG. 1. The semiconductor device SD according to the present embodiment is a power control element for supplying power to a load, and has: a first transistor TR1; a plurality of second transistors TR2; a first source contact SCON1; a first drain contact DCON1; a plurality of second source contacts SCON2; and a plurality of second drain contacts DCON2. The first transistor TR1 is an input transistor to which a control signal is input, and the second transistor TR2 is an output transistor that outputs power. The first transistor TR1 and the second transistors TR2 configure at least a part of a current mirror circuit.

The first transistor TR1 has: a first gate electrode GE1; a first source region SOU1; and a first drain region DRN1. The second transistor TR2 has: a second gate electrode GE2; a second source region SOU2; and a second drain region DRN2. Both of the first gate electrode GE1 and the second gate electrode GE2 extend in a first direction (a Y direction in FIG. 1). Additionally, the second transistors TR2 are arranged side-by-side in a direction (a second direction: an X direction in an example of FIG. 1) intersecting with the first direction. The first transistor TR1 is sandwiched between two second transistors TR21 (a first one of the second transistors TR2 and a second one of the second transistors TR2) in the second direction.

The first source contact SCON1 is coupled to the first source region SOU1, and the first drain contact DCON1 is coupled to the first drain region DRN1. The second source contacts SCON2 are coupled to the second source regions SOU2 different from each other, and are electrically coupled to each other. The second drain contacts DCON2 are coupled to the second drain regions DRN2 different from each other, and are electrically coupled to each other. Additionally, both of a distance (a first distance) between the second source contact SCON2 and a second drain contact DCON21 that are coupled to the one second transistor TR21 (the first one of the second transistors TR2), and a distance (a second distance) between the second source contact SCON2 and the second drain contact DCON21 that are coupled to the other second transistor TR21 are larger than a distance (a third distance) between the second source contact SCON2 and the second drain contact DCON2 that are coupled to a third one of the second transistors TR2 (a second transistor TR22) located farthest from the first transistor in the second direction. Hereinafter, a relation among the first to third distances will be explained in detail.

First, the relation among the first to third distances will be, explained using FIG. 1. The semiconductor device SD has a semiconductor substrate SUB, such as a silicon substrate. The first transistor TR1 and the second transistors TR2 are provided on the semiconductor substrate SUB. The second transistors TR2 are arranged at positions symmetrical to each other, for example, with respect to the first transistor TR1 so as to surround the first transistor TR1. Symmetry here includes both of line symmetry and point symmetry. More specifically, a plurality of transistors is arranged in the semiconductor device SD so as to configure a matrix. The first transistor TR1 is then provided at a center of this matrix.

In the example shown in FIG. 1, the two first transistors TR1 are arranged side by side in the X direction. Additionally, in the same row as the first transistor TR1, a third transistor TR3, the first one of the second transistors TR21, and the ordinary second transistors TR2 are arranged on both adjacent sides of the first transistor TR1, respectively in order close to the first transistor TR1 The ordinary second transistor TR2 has a configuration similar to that of the second transistor TR22.

The third transistor TR3 is a dummy transistor. Specifically, although the third transistor TR3 has a configuration similar to that of the ordinary second transistor TR2, a third gate electrode GE3 and a third source region SOU3 are electrically coupled to each other. Specifically, the third gate electrode GE3 and the third source region SOU3 are grounded. A distance between the second transistor TR2 closest to the first transistor TR1 and the first transistor TR1 can be increased by providing the third transistor TR3. As a result, even though an abnormal current, such as static electricity, flows through the second transistors TR2, it can be suppressed that the current concentrates on the second transistor TR2 located close to the first transistor TR1 to cause the second transistor TR2 to be broken.

In the example shown in FIG. 1, one third transistor TR3 is provided between the first transistor TR1 and the second transistor TR21. However, a plurality of (for example, two) the third transistors TR3 may be provided between the first transistor TR1 and the second transistor TR21.

All the ordinary second transistors TR2, i.e., the second transistors TR2 (the second one of the second transistors TR22 is included) other than the second transistor TR21 have configurations similar to each other. Additionally, the ordinary second transistors TR2 are provided in a row different from the first transistor TR1. As described above, the distance between the second source contact SCON2 (illustrated in FIG. 2) and the second drain contact DCON21 (illustrated in FIG. 2) in the second transistor TR21 is larger than a distance between the second source contact SCON2 (illustrated in FIG. 2) and a second drain contact DCON22 (illustrated in FIG. 2) in the second transistor TR22 (i.e., the ordinary second transistor TR2). For this reason, a width of the second transistor TR21 is larger than a width of the ordinary second transistor TR2 in the X direction of FIG. 1.

In the example shown in FIG. 1, two second transistors TR21 are provided between the first transistor TR1 and the ordinary second transistor TR2. However, only one second transistor TR21 may be provided between the first transistor TR1 and the ordinary second transistor TR2, and three or more second transistors TR21 may be provided therebetween. It is to be noted that it can be further suppressed that the abnormal current concentrates on the particular second transistor TR2 (details will be mentioned later) by providing the second transistors TR21.

It is to be noted that the semiconductor device SD may have a plurality of sets of the above-described first transistor TR1, second transistor TR2, and third transistor TR3. In this case, each of the sets controls output power different from each other.

Next, the relation among the first to third distances will be explained using FIG. 2. As described above, the third transistor TR3, the second transistor TR21 (two second transistors TR21 in an example shown in FIG. 2), and the ordinary second transistor TR2 (hereinafter described as the second transistor TR22) are arranged side-by-side beside the first transistor TR1 in the X direction. The first transistor TR1 has: the first gate electrode GE1; the first drain region DRN1; and the first source region SOU1. The third transistor TR3 has: the third gate electrode GE3; a third drain region DRN3; and the third source region SOU3. The second transistor TR21 has: a second gate electrode GE21; a second drain region DRN21; and a second source region SOU21, and the second transistor TR22 has: a second gate electrode GE22; a second drain region DRN22; and a second source region SOU22.

For details, the two first transistors TR1 share the one first source region SOUL. The first transistor TR1 and the third transistor TR3 adjacent thereto share one drain region (the first drain region DRN1 and the third drain region DRN3). The third transistor TR3 shares one source region (the third source region SOU3 and the second source region SOU2) with the second transistor TR21 adjacent to the third transistor TR3. The first transistor TR1 and the second transistor TR21 adjacent thereto share the one second drain region DRN2. Additionally, the second transistor TR21 located farthest from the first transistor TR1 and the second transistor TR22 adjacent to the second transistor TR21 share the second source region SOU2.

It is to be noted that all of the first transistor TR1, the second transistor TR2, and the third transistor TR3 are the same conductivity type transistors, and that the first source region SOU1, the second source region SOU2, the third source region SOU3, the first drain region DRN1, the second drain region DRN2, and the third drain region DRN3 are mutually the same conductivity type (for example, n-type) impurity regions. However, these impurity regions may be p-type impurity regions.

In a planar view, in each of the first transistor TR1, the third transistor TR3, the second transistor TR21, and the second transistor TR22, an element isolation film EI is provided between the gate electrode and the drain. As a result, in the first transistor TR1, the second transistor TR21, and the second transistor TR22, a withstand voltage between the gate and the drain becomes large.

For details, an element isolation film EI1 is provided between the first drain region DRN1 and the first gate electrode GE1, and an element isolation film EI3 is provided between the third drain region DRN3 and the third gate electrode GE3. In addition, an element isolation film EI21 is provided between the second drain region DRN21 and the second gate electrode GE21, and an element isolation film EI22 is provided between the second drain region DRN22 and the second gate electrode GE22. In the example shown in FIG. 2, a width D1 of the element isolation film EI1, a width D3 of the element isolation film EI22, and a width D4 of the element isolation film EI3 are equal to each other. Meanwhile, a width D2 of the element isolation film EI21 is larger than the width D3 of the element isolation film EI22. As a result, the distance between the second source contact SCON2 and the second drain contact DCON2 in the second transistor TR21 is larger than the distance between the second source contact SCON2 and the second drain contact DCON2 in the second transistor TR22.

As described above, the two second transistors TR21 are arranged side-by-side in the examples shown in FIGS. 1 and 2. Additionally, the widths D2 of the element isolation films EI21 in the two second transistors TR21 are equal to each other. However, the width D2 in the second transistor TR21 relatively closer to the first transistor TR1 may be larger than the width D2 in the second transistor TR21 located relatively farther from the first transistor TR1.

Additionally, the same power supply wiring is coupled to the first drain region DRN1 and the first gate electrode GE1 of the first transistor TR1, and a' ground potential is applied to the first source region SOU1. In addition, the ground potential is applied to the third source region SOU3 and the third gate electrode GE3 of the third transistor TR3. In addition, in the second transistors TR2 (including the second transistor TR21 and the second transistor TR22), the same wiring is coupled to the second gate electrode GE2, the same wiring is coupled to the second drain region DRN2, and the second source region SOU2 is grounded. It is to be noted that a voltage input to the first drain region DRN1 is, for example, not less than 0.3 V and not more than 15 V, and that a voltage input to the second drain region DRN2 is, for example, not less than 0.3 V and not more than 80 V.

It is to be noted that a plurality of wells is formed in the semiconductor substrate SUB. For details, a well WL1 having a conductivity type opposite to that of the first source region SOU1 is formed in a region where the first source region SOU1 and the first gate electrode GE1 have been formed, and a well WL12 having the same conductivity type as that of the first drain region DRN1 is formed in a region where the first drain region DRN1 and the element isolation films EI1 and EI3 have been formed. In addition, a well WL3 having a conductivity type opposite to that of the third source region SOU3 is formed in a region where the third source region SOU3, the second gate electrode GE21, and the third gate electrode GE3 have been formed. In addition, a well WL21 having the same conductivity type as that of the second drain region DRN21 is formed in a region where the second drain region DRN21 and the element isolation film EI21 have been formed, and a well WL2 having a conductivity type opposite to that of the second source region SOU21 is formed in a region where the second source region SOU21, the second gate electrode GE21, and the second gate electrode GE22 have been formed. Furthermore, a well WL22 having the same conductivity type as that of the second drain region DRN22 is formed in a region where the second drain region DRN22 and the element isolation film EI22 have been formed. Additionally, in order to apply a potential to a well, a high concentration region having the same conductivity type as that of the well is formed in a surface layer of each well.

Additionally, a width of the well WL21 is larger than a width of the well WL22.

Next, an effect of the present embodiment will be explained. An abnormal current, such as static electricity, may flow through a wiring coupled to the second drain region DRN2 of the second transistor TR2 in the semiconductor device SD. This abnormal current flows from the second drain region DRN2 to the second source region SOU2 through the well. As a result of examination by the present inventor, it turned out that more current tended to flow through the second transistor TR2 located close to the first transistor TR1 of the second transistors TR2 than the other second transistors TR2. The reason is considered to be such that the voltage (i.e., the voltage of the well WL12) input to the first drain region DRN1 is lower with respect to the voltage (i.e., the voltage of the well WL21) input to the second drain region DRN2, and that thereby a potential of the well WL3 also becomes lower than a potential of the well WL2.

In contrast to this, in the present embodiment, a distance between the second source contact SCON2 and the second drain contact DCON2 in the second transistor TR2 (the second transistor TR21) closest to the first transistor TR1 is larger than a distance between the second source contact SCON2 and the second drain contact DCON2 in the second transistor TR22 located farthest from the first transistor TR1. For this reason, a resistance between the drain and the source in the second transistor TR21 is larger than a resistance between the drain and the source in the second transistor TR22. Accordingly, it can be suppressed that the abnormal current concentrates on the second transistor TR21.

Figure 3:
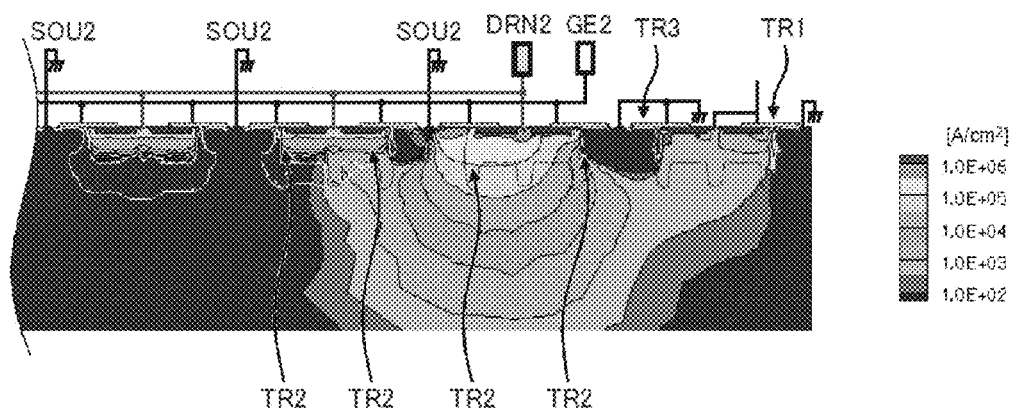
FIG. 3 is a diagram showing a simulation result of a current density when an abnormal current flows through a wiring coupled to a second drain region of a second transistor in a comparative example.
Figure 4:
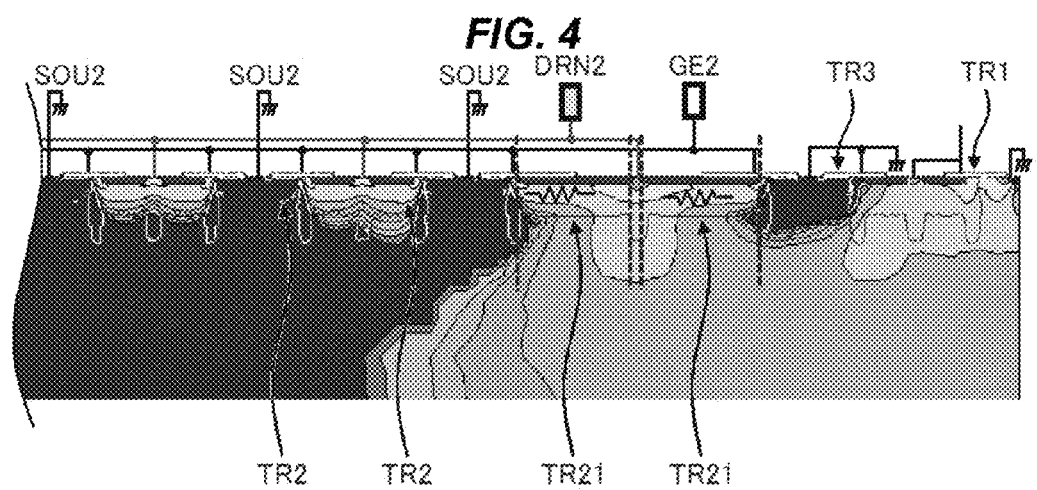
FIG. 4 is a diagram showing a simulation result of a current density when an abnormal current flows through a wiring coupled to a second drain region of a second transistor in an embodiment.

FIGS. 3 and 4 are diagrams showing simulation results of a current density when an abnormal current flows through a wiring coupled to the second drain region DRN2 of the second transistor TR2 in a semiconductor device SD (FIG. 3) according to a comparative example and the semiconductor device SD (FIG. 4) according to the embodiment, respectively. The semiconductor device SD according to the comparative example has a configuration similar to that of the semiconductor device SD according to the embodiment except for a point of having the ordinary second transistor TR2 instead of the second transistor TR21. When FIGS. 3 and 4 are compared with each other, it is proved that concentration of the current on the particular second transistor TR2 can be suppressed by providing the second transistor TR21.

Figure 5:
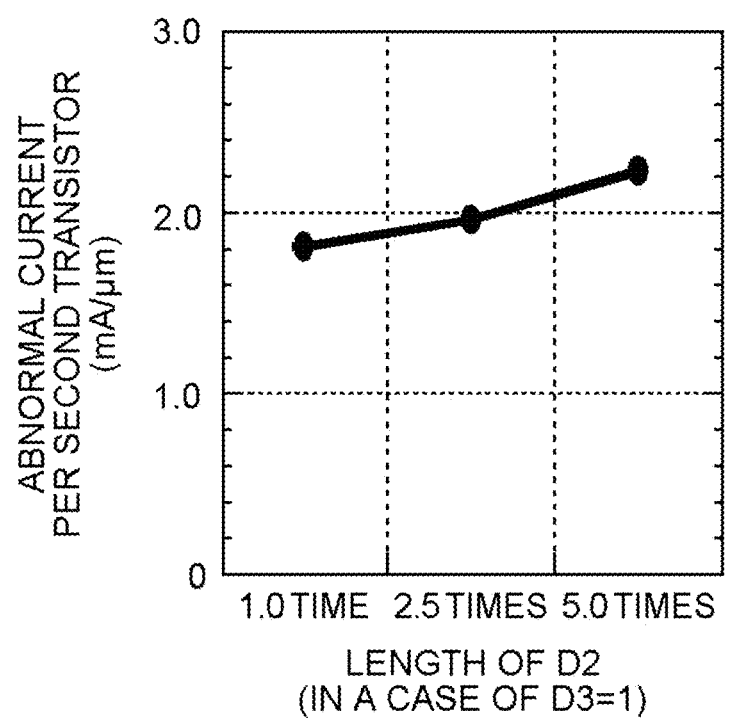
FIG. 5 is a graph showing dependence of an amount of an abnormal current that can be made to flow through one second transistor with respect to a width of an element isolation film EI21.

FIG. 5 is a graph showing dependence of an amount of an abnormal current that can be made to flow through one second transistor TR2 with respect to the width D2 of the element isolation film EI21 shown in FIG. 2. In FIG. 5, the width D2 is shown based on the width D3 of the element isolation film EI22. It is proved from FIG. 5 that the amount of the abnormal current that can be made to flow through one second transistor TR2 increases as the width D2 is expanded (for example, the width D2 is set to be 2 times or 5 times the width D3).

(Second Embodiment)

Figure 6:
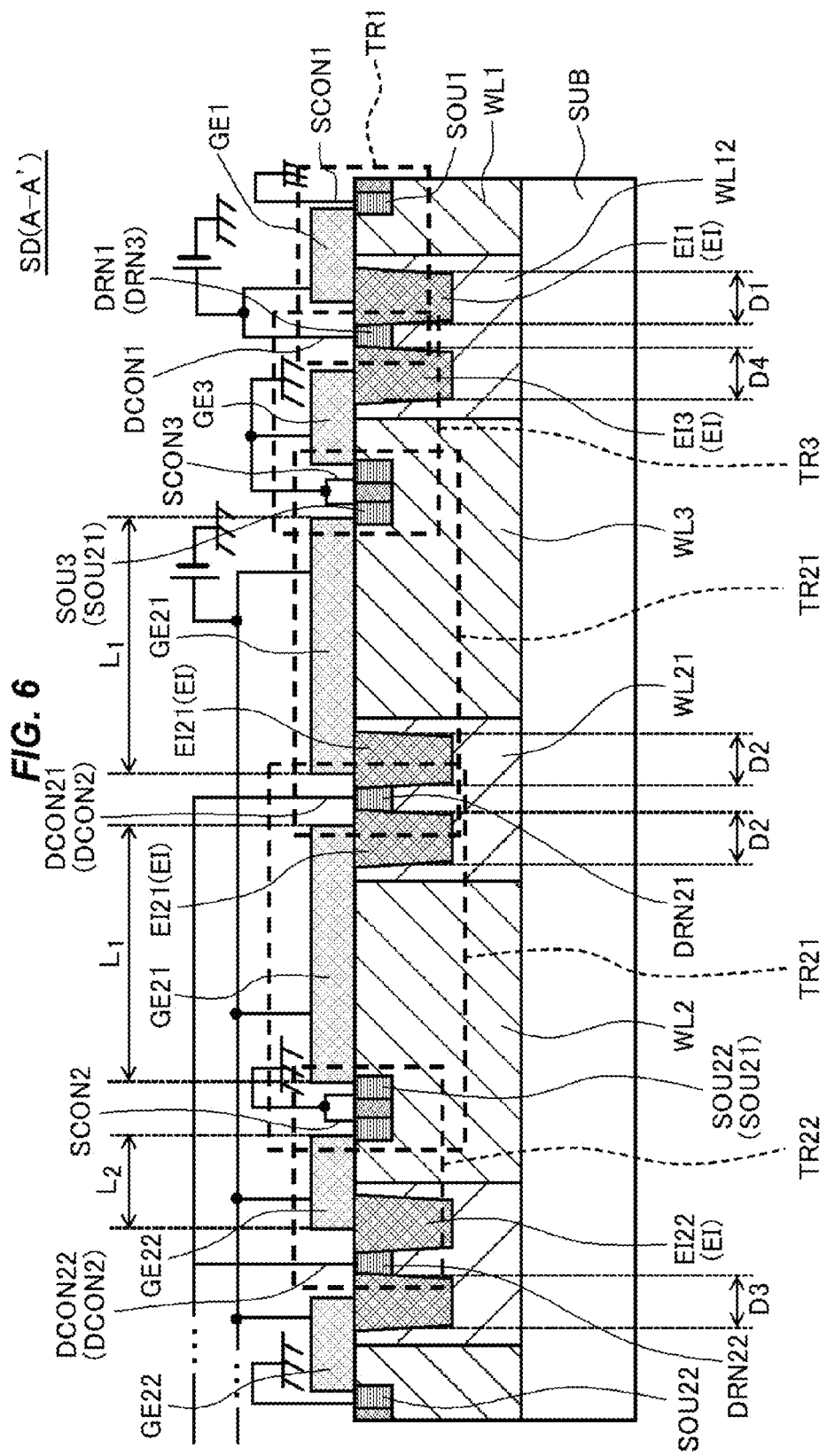
FIG. 6 is a cross-sectional view of a semiconductor device according to a Second Embodiment.

FIG. 6 is a cross-sectional view of a semiconductor device SD according to a Second Embodiment, and corresponds to FIG. 2 in the First Embodiment. The semiconductor device SD according to the present embodiment has a configuration similar to that of the semiconductor device SD according to the First Embodiment except for a structure of the second transistor TR21.

In the embodiment, the width D2 of the element isolation film EI21 is the same as the width D3 of the element isolation film EI22. Instead of that, a width L1 of the second gate electrode GE21 is wider than a width L0 of the second gate electrode GE22. In addition, the width of the well WL21 is larger than the width of the well WL22.

For this reason, also according to the present embodiment, the distance between the second source contact SCON2 and the second drain contact DCON2 in the second transistor TR21 is larger than the distance between the second source contact SCON2 and the second drain contact DCON2 in the second transistor TR22. Accordingly, an effect similar to that of the First Embodiment is obtained.

It is to be noted that the widths L1 of the second gate electrodes GE21 in the two second transistors TR21 are equal to each other. However, the width L1 in the second transistor TR21 relatively closer to the first transistor TR1 may be larger than the width L1 in the second transistor TR21 located relatively farther from the first transistor TR1.

Figure 7:
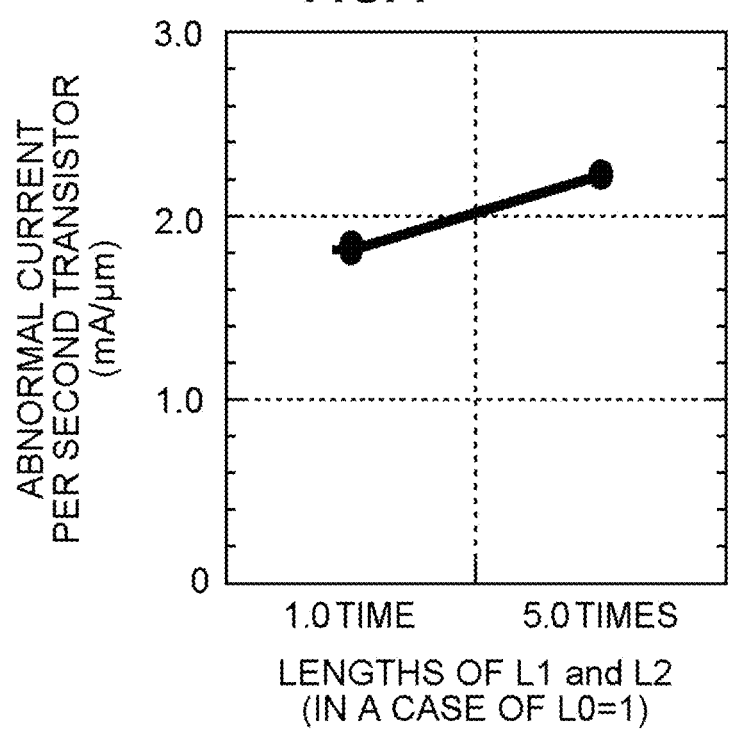
FIG. 7 is a graph showing dependence of the amount of the abnormal current that can be made to flow through one second transistor with respect to a width of a second gate electrode.

FIG. 7 is a graph showing dependence of an amount of an abnormal current that can be made to flow through one second transistor TR2 with respect to the width L1 of the second gate electrode GE21 shown in FIG. 6. In FIG. 7, the width L1 is shown based on the width L0 of the second gate electrode GE22. It is proved from FIG. 7 that the amount of the abnormal current that can be made to flow through one second transistor TR2 increases when the width L1 is expanded (for example, the width L1 is set to be 5 times the width L0).

(Third Embodiment)

Figure 8:
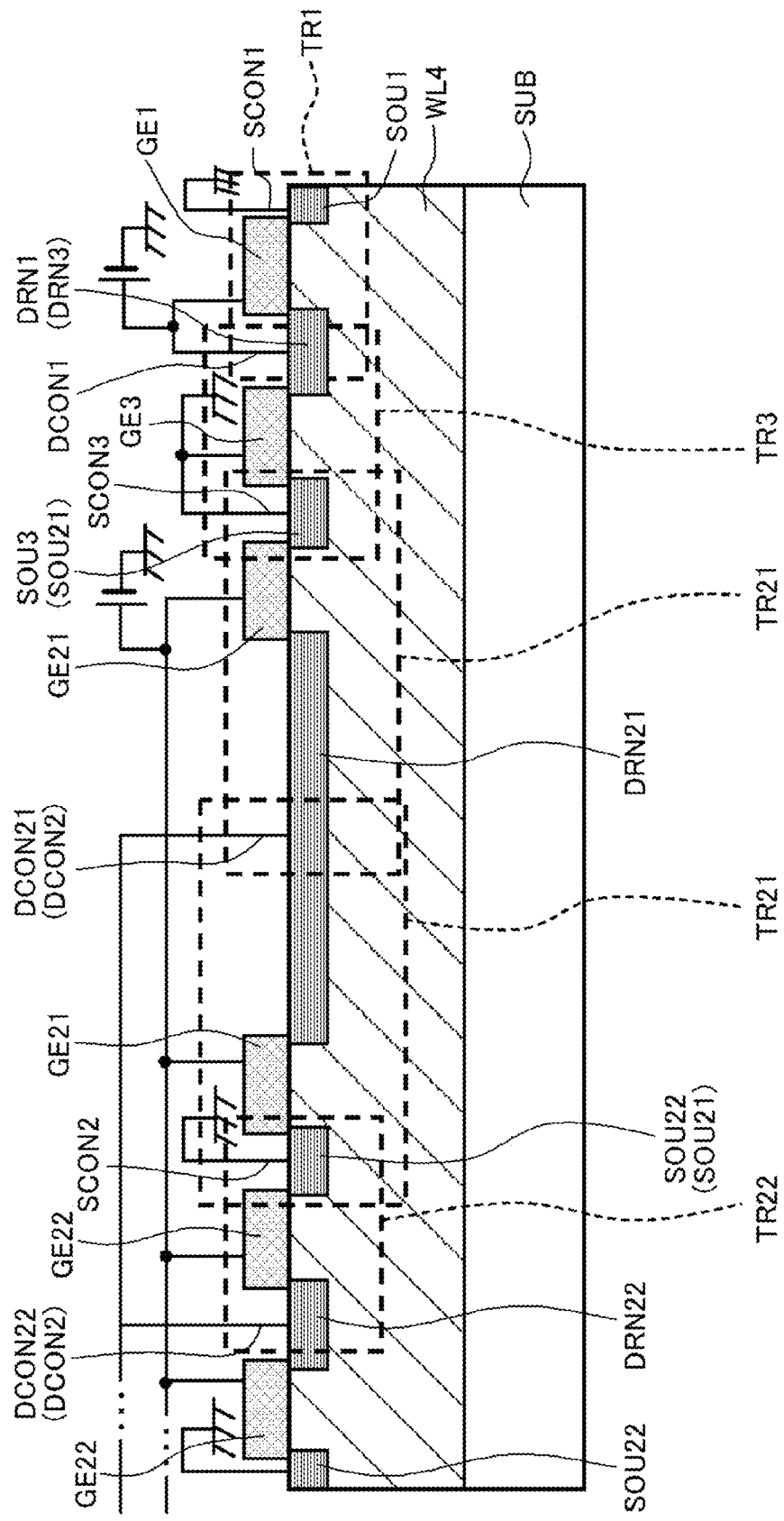
FIG. 8 is a cross-sectional view showing a configuration of a semiconductor device according to a Third Embodiment.

FIG. 8 is a cross-sectional view showing a configuration of a semiconductor device SD according to a Third Embodiment. The semiconductor device SD according to the present embodiment has a configuration similar to that of the semiconductor device SD according to the First Embodiment except for the following points.

First, there is no element isolation film between the drain and the gate in each transistor. In other words, the semiconductor device SD does not have the element isolation films EI1, EI21, EI22, and EI3. Instead of that, lengths of the drains (lengths of the first drain, region DRN1, the second drain region DRN21, the second drain region DRN22, and the third drain region DRN3) are set to be longer. Namely, the transistors are CMOS transistors in the present embodiment. In addition, the first transistor TR1, the second transistor TR2, and the third transistor TR3 have a common well WL4. The well WL4 has a conductivity type opposite to that of the first drain region DRN1.

Also according to the present embodiment, an effect similar to that of the First Embodiment is obtained.

(Fourth Embodiment)

Figure 9:
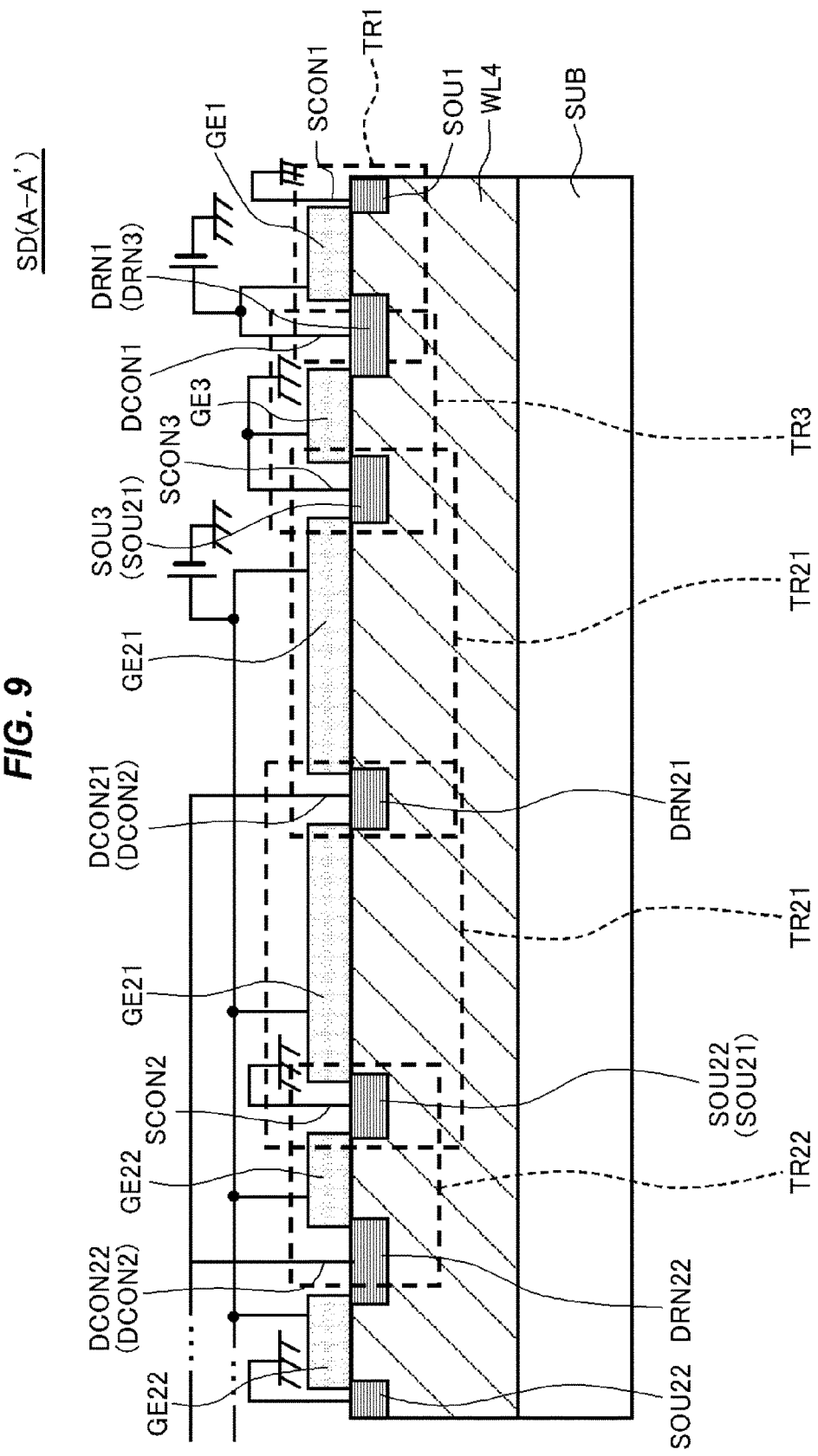
FIG. 9 is a cross-sectional view showing a configuration of a semiconductor device according to a Fourth Embodiment.

FIG. 9 is a cross-sectional view showing a configuration of a semiconductor device SD according to a Fourth Embodiment. The semiconductor device SD according to the present embodiment has a configuration similar to that of the semiconductor device SD according to the Second Embodiment except for the following points.

First, there is no element isolation film between the drain and the gate in each transistor. In other words, the semiconductor device SD does not have the element isolation films EI1, EI21, EI22, and EI3. Namely, the transistors are CMOS transistors in the present embodiment.

Also according to the present embodiment, an effect similar to that of the Second Embodiment is obtained.

(Fifth Embodiment)

Figure 10:
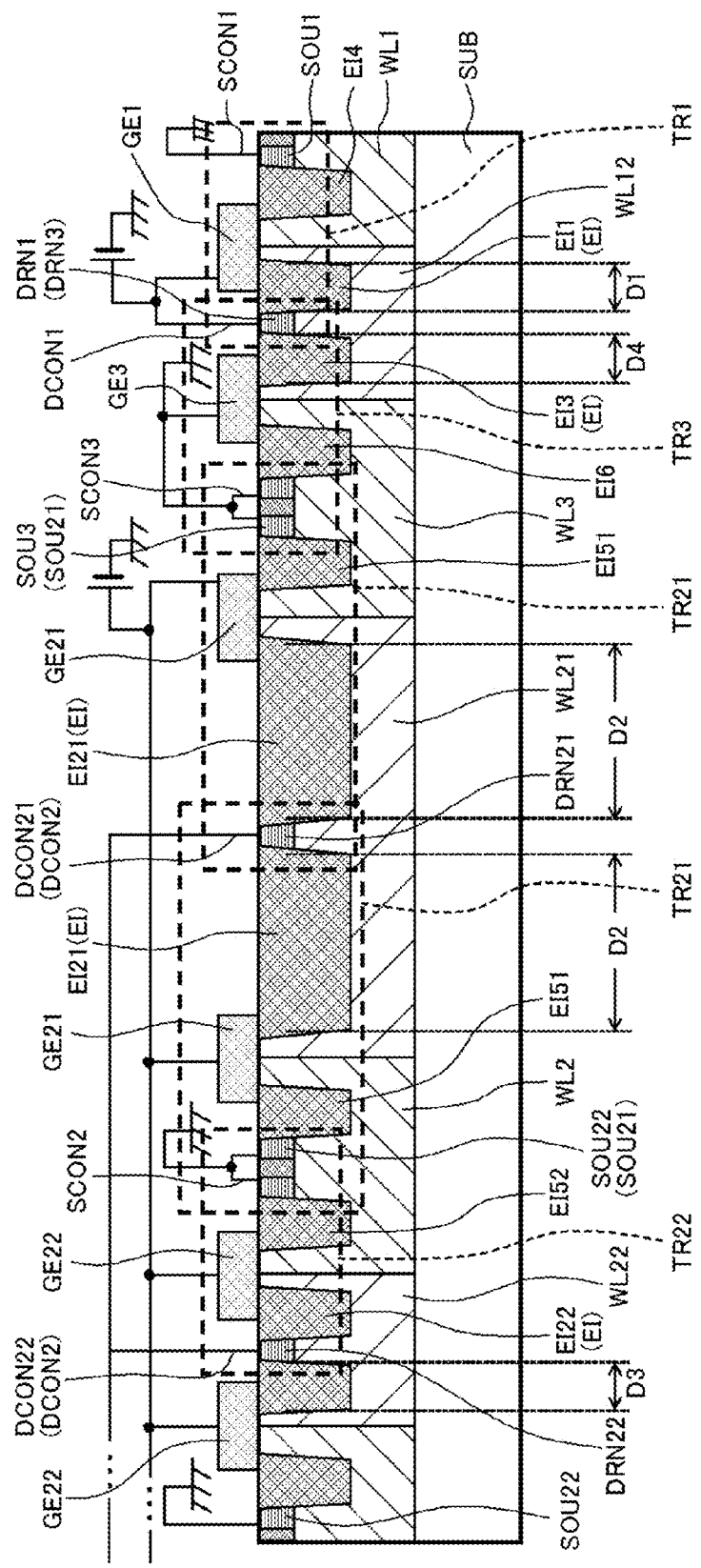
FIG. 10 is a cross-sectional view showing a configuration of a semiconductor device according to a Fifth Embodiment.

FIG. 10 is a cross-sectional view showing a configuration of a semiconductor device SD according to a Fifth Embodiment. The semiconductor device SD according to the present embodiment has a configuration similar to that of the semiconductor device SD according to the First Embodiment except for a point of having element isolation films EI4, EI51, EI52, and EI6. The element isolation film EI4 is located between the first gate electrode GE1 and the first source region SOU1, and the element isolation film EI51 is located between the second gate electrode GE21 and the second source region SOU21. The element isolation film EI52 is located between the second gate electrode GE22 and the second source region SOU22, and the element isolation film EI6 is located between the third gate electrode GE3 and the third source region SOU3. Namely, each transistor is a bi-directional DMOS transistor in the present embodiment. All widths of the element isolation films EI4, EI51, EI52, and EI6 are the same as each other.

Figure 11:
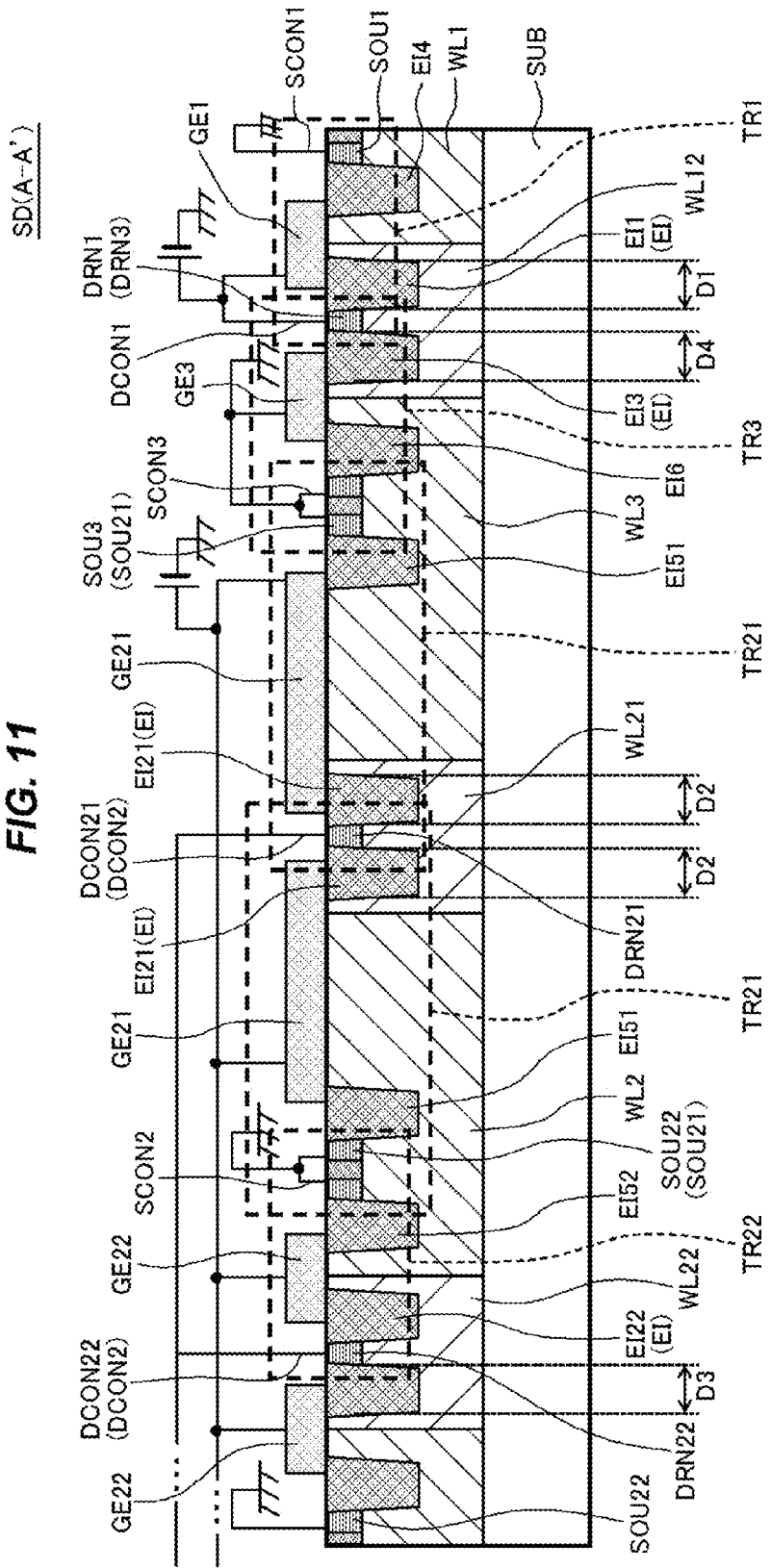
FIG. 11 is a cross-sectional view showing a modification of FIG. 10.

It is to be noted that as shown in FIG. 11, the element isolation films EI4, EI51, EI52, and EI6 may be provided in the semiconductor device SD shown in the Second Embodiment.

Also according to the present embodiment, an effect similar to that of the First Embodiment is obtained.

(Sixth Embodiment)

Figure 12:
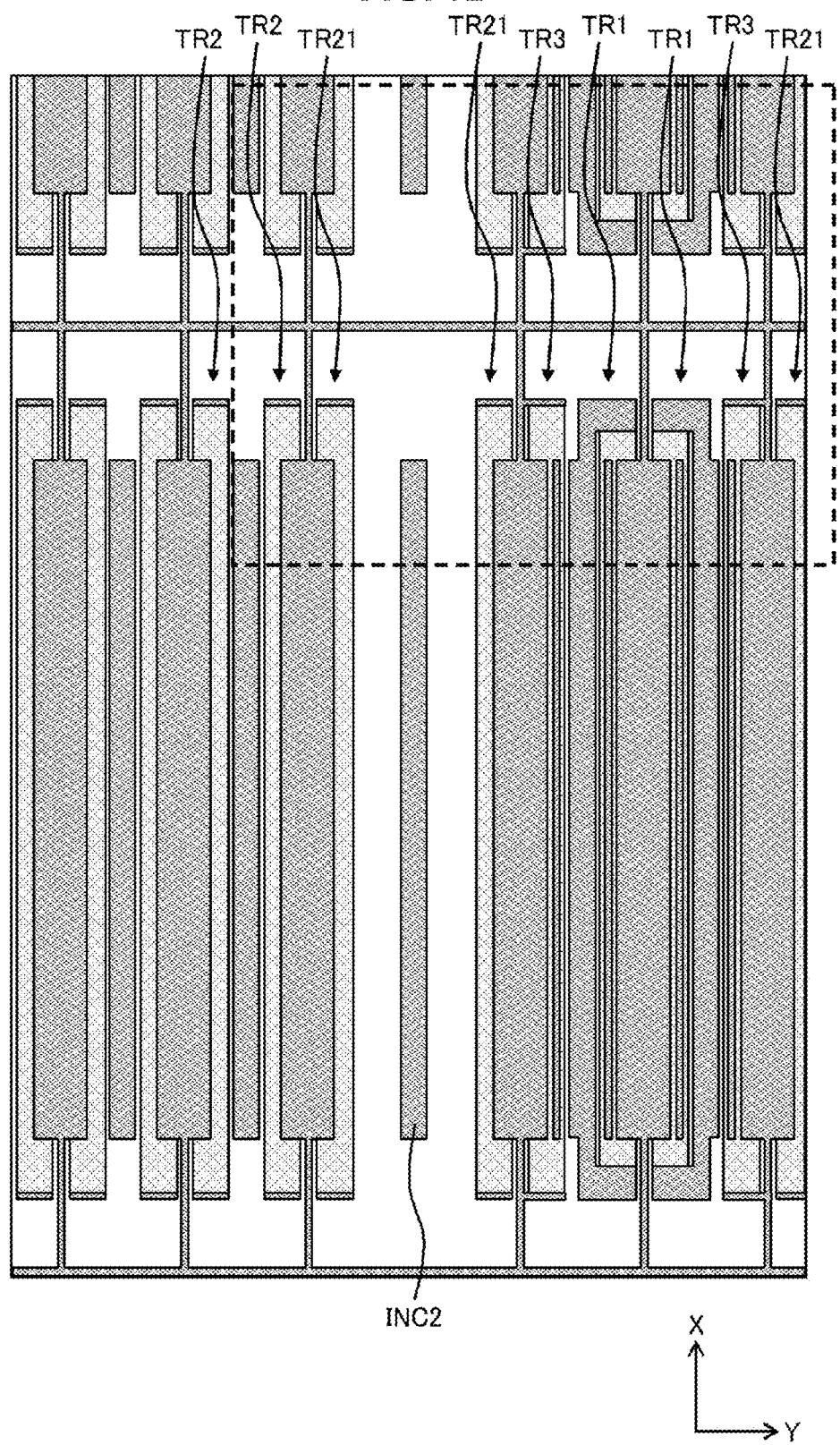
FIG. 12 is a plan view of a semiconductor device according to a Sixth Embodiment.
Figure 13:
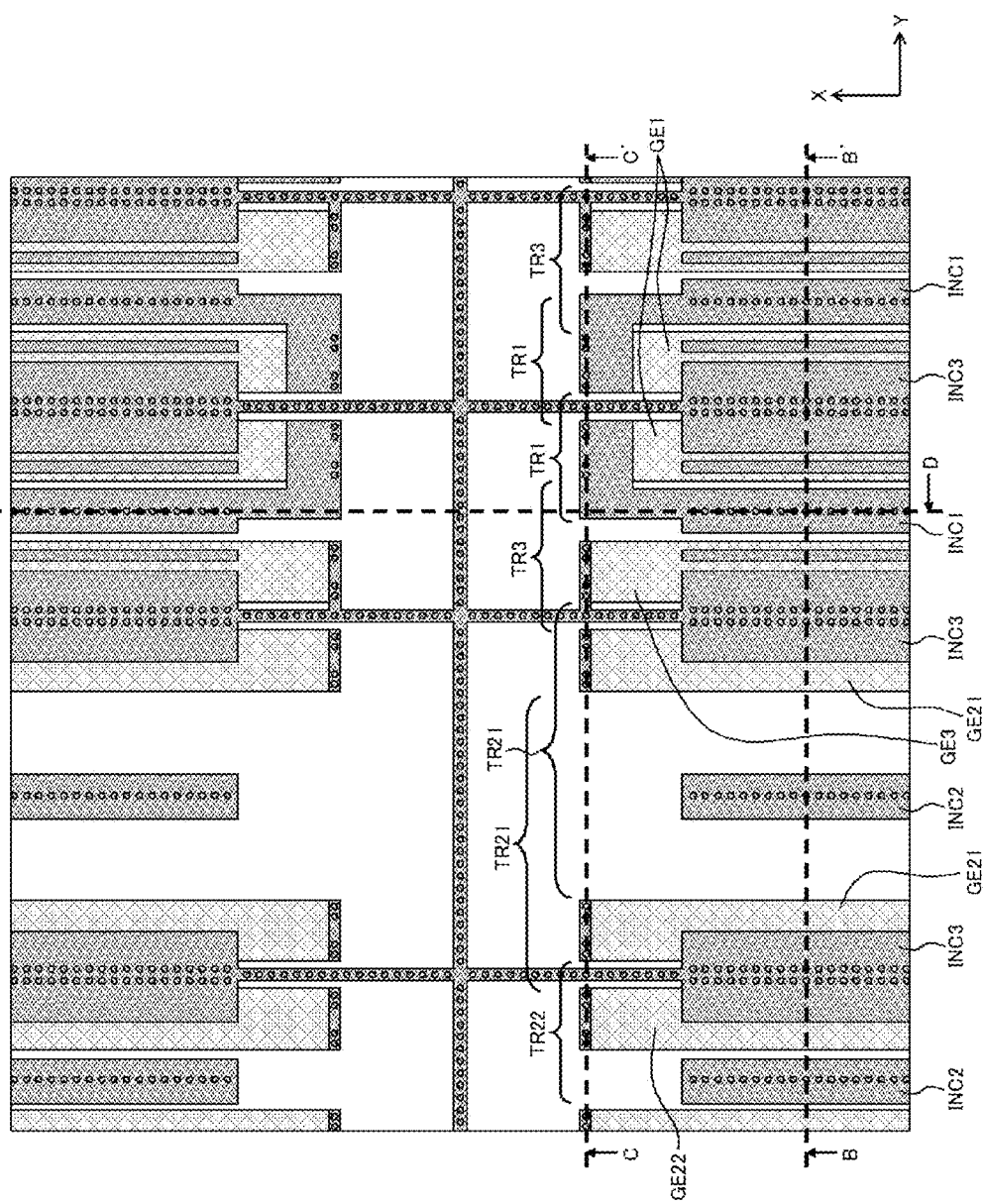
FIG. 13 is an enlarged view of a portion surrounded by a dotted line of FIG. 12.
Figure 14:
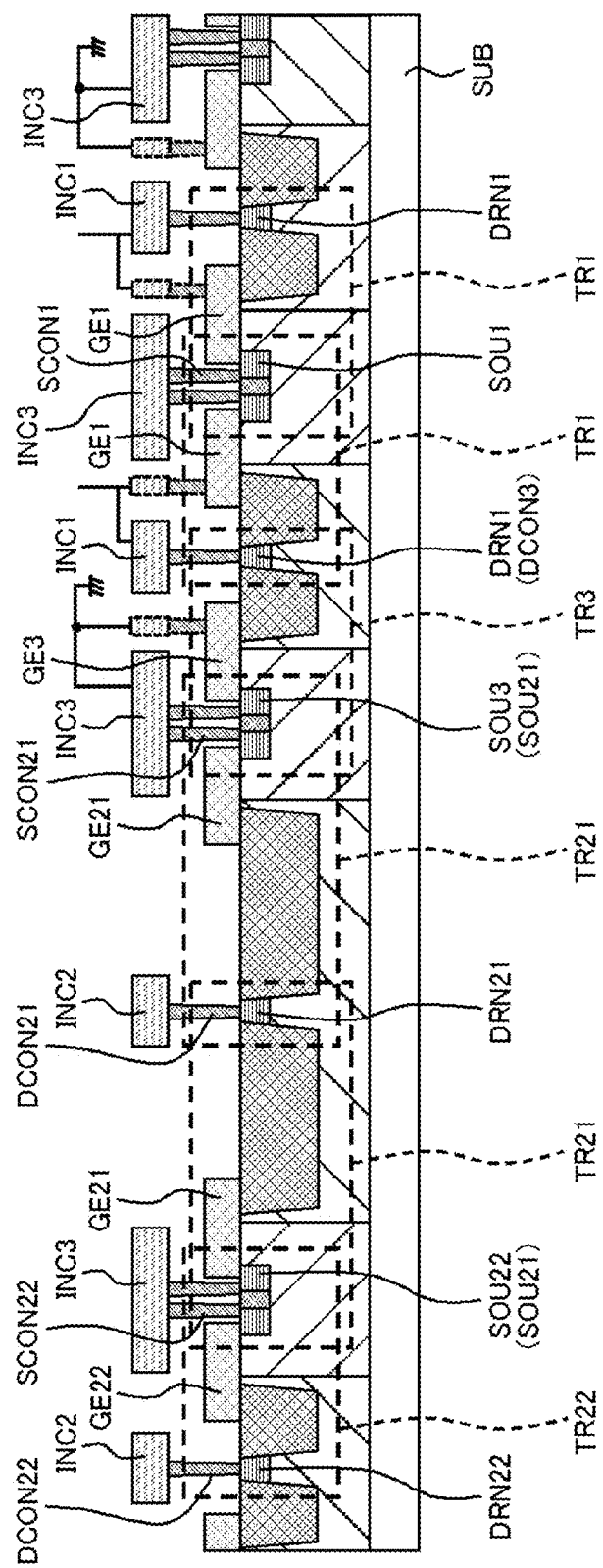
FIG. 14 is across-sectional view taken along a line B-B' of FIG. 13.
Figure 15:
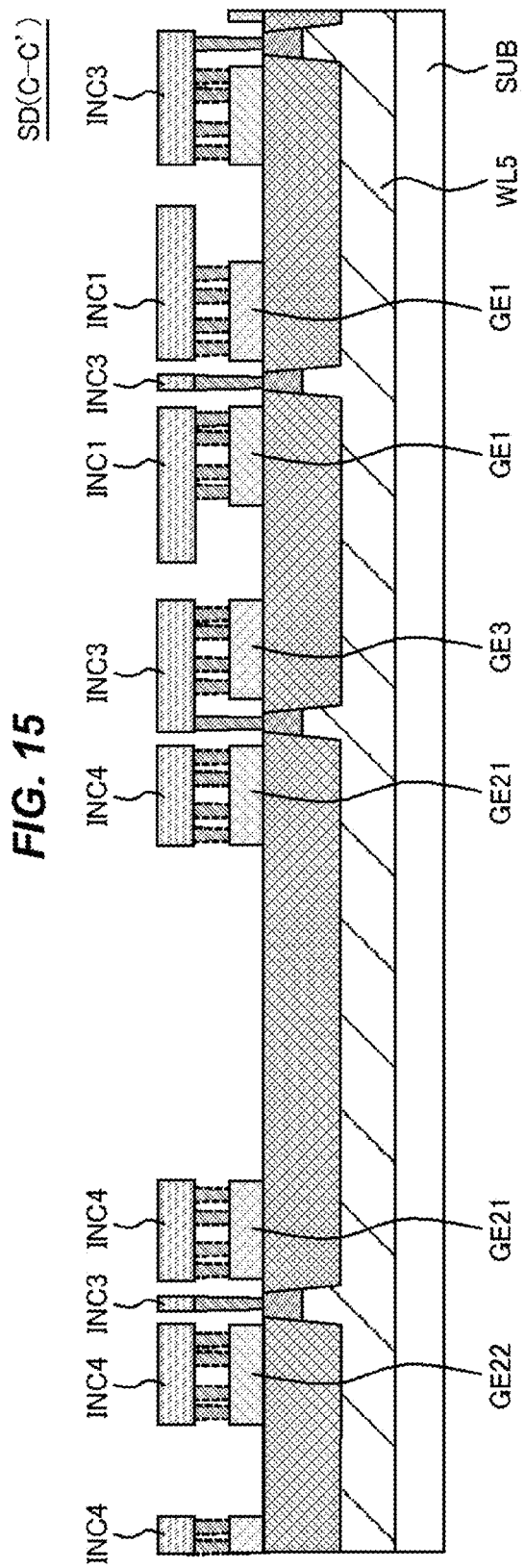
FIG. 15 is a cross-sectional view taken along a line C-C' of FIG. 13.

FIG. 12 is a plan view showing a configuration of semiconductor device SD according to a Sixth Embodiment. FIG. 13 is an enlarged view of a portion surrounded by a dotted line of FIG. 12. FIG. 14 is a cross-sectional view taken along a line B-B' of FIG. 13, and FIG. 15 is a cross-sectional view taken along a line C-C' of FIG. 13. The semiconductor device SD according to the present embodiment has a configuration similar to that of any of the semiconductor devices SD according to the First to Fifth Embodiments except for the following points. It is to be noted that FIG. 14 shows a case similar to the semiconductor device SD according to the First Embodiment.

Similarly to the above-described embodiments, the first transistor TR1, the second transistors TR2, and the third transistor TR3 are arranged on the semiconductor substrate SUB so as to form a matrix. Additionally, a multilayer wiring layer is formed over the semiconductor substrate SUB. Additionally, as shown in FIGS. 13 and 14, wirings INC1, INC2, and INC3 are formed in a first-layer wiring layer.

The wiring INC1 is coupled to the first drain region DRN1 of the first transistor TR1 through the first drain contact DCON1, and is coupled to the first gate electrode GE1 of the first transistor TR1 through a contact.

The wiring INC2 is coupled to the second drain region DRN21 through the second drain contact DCON21, and is coupled to the second drain region DRN22 through the second drain contact DCON22.

The wiring INC3 is coupled to the first source region SOU1 through the first source contact SCON1, is coupled to the second source region SOU21 (the third source region SOU3) through the second source contact SCON21, and is further coupled to the second source region SOU22 through the second source contact SCON22.

In addition, as shown, in FIG. 15, a conductor INC4 is formed in the first-layer wiring layer. The conductor INC4 is coupled to the second gate electrode GE21 through contacts. In addition, the wiring INC3 is coupled to the third gate electrode GE3 and a well WL5 through contacts. The well WL5 has a conductivity type opposite to that of the first drain region DRN1, and is linked to the wells WL1, WL2, and WL3.

FIG. 16 is a cross-sectional view taken along a line D-D' of FIG. 13. As shown in FIG. 16, the well WL5 is formed between the first transistor TR1 and the second transistor TR2 (having a structure similar to that of the second transistor TR22) that belongs to a row different from the first transistor TR1. Additionally, the wiring INC3 is coupled to the well WL5 through a contact. The wiring INC3 is a ground wiring, and fixes a potential of the well WL5. Accordingly, even though the second transistor TR21 is not used as the second transistor TR2 belonging to the row different from the first transistor TR1, an abnormal current does not concentrate on the second transistor TR2.

Hereinbefore, although the invention made by the present inventor has been specifically explained based on the embodiments, the present invention is not limited to the embodiments, and it is needless to say that various changes can be made without departing from the scope of the invention.

What is claimed is:

1. A semiconductor device comprising:
   a first transistor having a first gate electrode, a first source region, and a first drain region, the first gate electrode extending in a first direction;
   a plurality of second transistors each having a second gate electrode, a second source region, and a second drain region, the second gate electrode extending in the first direction and the plurality of second transistors being arranged side-by-side along a second direction intersecting with the first direction;
   a first source contact coupled to the first source region;
   a first drain contact coupled to the first drain region;
   a plurality of second source contacts each coupled to the second source region different from each other, and electrically coupled to each other; and
   a plurality of second drain contacts each coupled to the second drain region different from each other, and electrically coupled to each other,
   wherein the first transistor is sandwiched between a first one of the second transistors and a second one of the second transistors in the second direction,
   wherein both of a first distance between the second source contact and the second drain contact of the first one of the second transistors, and a second distance between the second source contact and the second drain contact of the second one of the second transistors are larger than a third distance between the second source contact and the second drain contact that are coupled to a third one of the second transistors located farthest from the first transistor in the second direction,
   wherein, in the first one of, the second one of, and the third one of the second transistors, an element isolation film is located between the second gate electrode and the second drain region, and
   wherein, in the second direction, both of a width of the element isolation film in the first one of the second transistors and a width of the element isolation film in the second one of the second transistors are larger than a width of the element isolation film in the third one of the second transistors.

2. The semiconductor device according to claim 1, wherein, in the second direction, both of a width of the gate electrode in the first one of the second transistors and a width of the gate electrode in the second one of the second transistors are larger than a width of the gate electrode in the third one of the second transistors.

3. The semiconductor device according to claim 1, further comprising:
   a plurality of third transistors, which are located between the first transistor and the first one of the second transistors and between the first transistor and the second one of the second transistors, respectively,
   wherein a gate electrode of each of the third transistors is electrically coupled to a source region thereof.

4. The semiconductor device according to claim 1, wherein, in the second direction, the first one of the second transistors is adjacent to another one of the second transistors, and the second one of the second transistors is adjacent to another one of the second transistors.

5. A semiconductor device comprising:
   a first transistor having a first gate electrode, a first source region, and a first drain region, the first gate electrode extending in a first direction;
   a plurality of second transistors each having a second gate electrode, a second source region, and a second drain region, the second gate electrode extending in the first direction and the plurality of second transistors being arranged side-by-side along a second direction intersecting with the first direction;
   a plurality of third transistors located between the first transistor and the second transistors;
   a first source contact coupled to the first source region;
   a first drain contact coupled to the first drain region;
   a plurality of second source contacts each coupled to the second source region different from each other, and electrically coupled to each other; and
   a plurality of second drain contacts each coupled to the second drain region different from each other, and electrically coupled to each other,
   wherein the first transistor is sandwiched between a first one of the second transistors and a second one of the second transistors in the second direction,
   wherein a first one of the third transistors is located between the first transistor and the first one of the second transistors, and a second one of the third transistors is located between the first transistor and the second one of the second transistors,
   wherein a gate electrode of each of the third transistors is electrically coupled to a source region thereof, and
   wherein both of a first distance between the second source contact and the second drain contact of the first one of the second transistors, and a second distance between the second source contact and the second drain contact of the second one of the second transistors are larger than a third distance between the second source contact and the second drain contact that are coupled to a third one of the second transistors located farthest from the first transistor in the second direction.

6. The semiconductor device according to claim 5, wherein, in the first one of, the second one of, and the third one of the second transistors, an element isolation film is located between the second gate electrode and the second drain region.

7. The semiconductor device according to claim 6, wherein, in the second direction, both of a width of the element isolation film in the first one of the second transistors and a width of the element isolation film in the second one of the second transistors are larger than a width of the element isolation film in the third one of the second transistors.

8. The semiconductor device according to claim 5, wherein, in each of the second transistors, the element isolation film is located between the second gate electrode and the second source region.

9. The semiconductor device according to claim 5, wherein, in the second direction, both of a width of the gate electrode in the first one of the second transistors and a width of the gate electrode in the second one of the second transistors are larger than a width of the gate electrode in the third one of the second transistors.

10. The semiconductor device according to claim 5, wherein, in the second direction, the first one of the second transistors is adjacent to another one of the second transistors, and the second one of the second transistors is adjacent to another one of the second transistors.

* * * * *